United States Patent [19]

Prestage

[11] Patent Number: 5,420,549
[45] Date of Patent: May 30, 1995

[54] EXTENDED LINEAR ION TRAP FREQUENCY STANDARD APPARATUS

[75] Inventor: John D. Prestage, Pasadena, Calif.

[73] Assignee: The United States of America as represented by the Administrator of the National Aeronautics and Space Administration, Washington, D.C.

[21] Appl. No.: 246,041

[22] Filed: May 13, 1994

[51] Int. Cl.$^6$ .............................................. H03L 7/26
[52] U.S. Cl. ...................... 331/94.1; 331/3; 324/304
[58] Field of Search ..................... 331/3, 94.1; 324/304

[56] References Cited

U.S. PATENT DOCUMENTS 5,248,883  9/1993  Brewer et al. ..................... 250/292

OTHER PUBLICATIONS

Leonard S. Cutler et al., "A Trapped Mercury 199 Ion Frequency Standard," Proc. of 13th Annual Precise Time and Time Interval (PTTI) Applications & Planning Meeting, NASA Conf. Pub. 2220, pp. 563–577, Dec. 1–3, 1981.
John D. Prestage et al., "Ultra–Stable Hg+ Trapped Ion Frequency Standard," Journal of Modern Optics, vol. 39, pp. 221–232, 1992.
R. L. Tjoelker et al., "Long Term Stability of Hg+ Trapped Ion Frequency Standards," 1993 IEEE International Frequency Control Symposium, pp. 132–138.
L. S. Cutler et al., "Thermalization of $^{199}$Hg Ion Macromotion by a Light Background Gas in an RF Quadrupole Trap," Appl. Phys. B36, pp. 137–142, 1985.
J. D. Prestage et al., "New Ion Trap for Frequency Standard Applications," J. Appl. Phys. 66, pp. 1013–1017, Aug. 1, 1989.

Primary Examiner—Siegfried H. Grimm
Attorney, Agent, or Firm—John H. Kusmiss; Thomas H. Jones; Guy M. Miller

[57] ABSTRACT

A linear ion trap for frequency standard applications is provided with a plurality of trapping rods equally spaced and applied quadrupole rf voltages for radial confinement of atomic ions and biased level pins at each end for axial confinement of the ions. The trapping rods are divided into two linear ion trap regions by a gap in each rod in a common radial plane to provide dc discontinuity, thus dc isolating one region from the other. A first region for ion-loading and preparation/fluorescence is biased with a dc voltage to transport ions into a second region for resonance/frequency comparison with a local oscillator derived frequency while the second region is held at zero voltage. The dc bias voltage of the regions is reversed for transporting the ions back into the first region for fluorescence/measurement. The dual mode cycle is repeated continuously for comparison and feedback control of the local oscillator derived frequency. Only the second region requires magnetic shielding for the resonance function which is sensitive to any ambient magnetic fields.

4 Claims, 7 Drawing Sheets

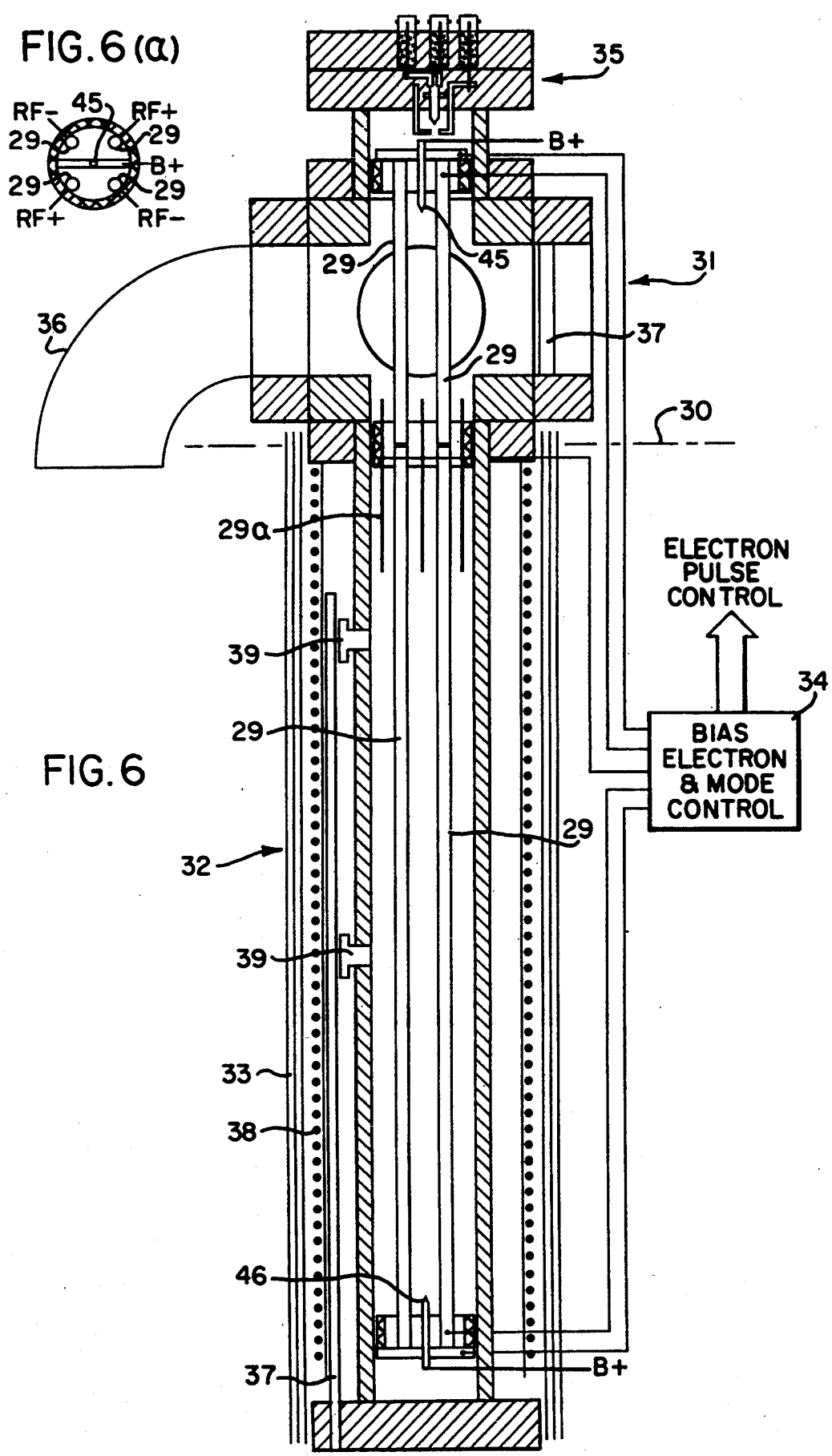

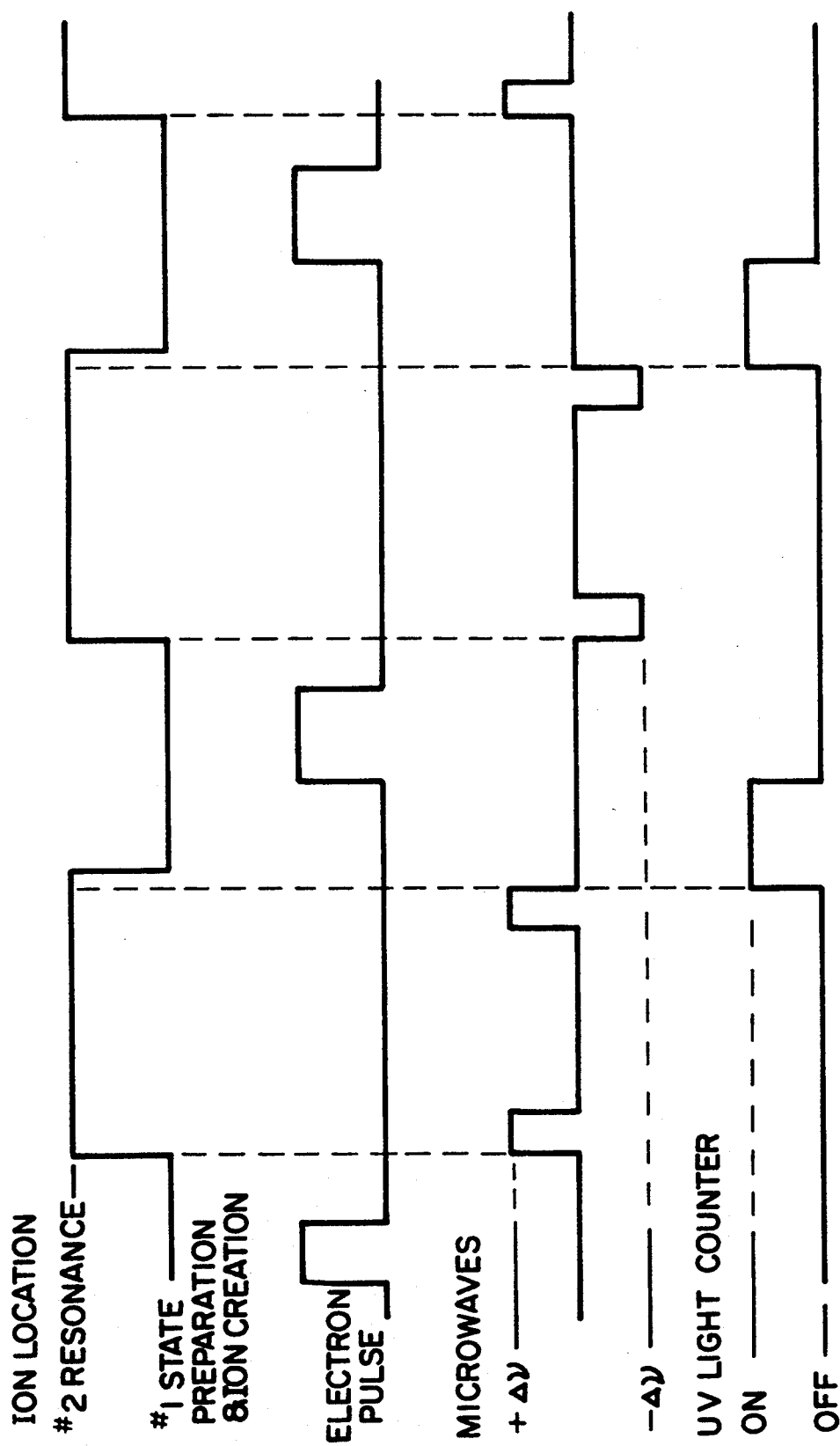

EXTENDED LINEAR ION TRAP FREQUENCY STANDARD APPARATUS

ORIGIN OF THE INVENTION

The invention described herein was made in the performance of work under a NASA contract and is subject to the provisions of Public Law 96-157 (35 USC 202) in which the Contractor has elected not to retain title.

FIELD OF THE INVENTION

The invention relates to a frequency standard based on ions confined in a linear ion trap. The terms "frequency standard" and "atomic clock" or simply "clock" are sometimes used herein interchangeably since there is no fundamental difference between them in context. Both have been used in the literature to refer to apparatus based upon the number of cycles of transition within a neutral or charged atom or molecule over the period of a second.

BACKGROUND OF THE INVENTION

Atomic frequency standards are required for various commercial, scientific and military applications. Atomic standards are necessary for communication systems, such as the national telephone networks (AT&T, etc.), ground stations for the planned satellite based cellular telephone networks, and in fact, for satellite ground stations of all types. All simulcast communication systems such as television and radio networks reference atomic standards for stable signal frequency. Navigation systems such as Loran-C and Navstar Global Positioning Satellite (GPS) systems use atomic clocks in the source and sometimes the user equipment. Long baseline radio astronomy requires an atomic clock at each antenna for synchronization of faint signals received from deep space radio objects. National time and frequency standards laboratories in every industrialized country worldwide maintain ensembles of various stable atomic clocks.

The vast majority of clocks in use today are based on quartz crystal oscillators. Examples include wrist watches, wall clocks, etc. There are many reasons why they can be made reliably and inexpensively. Single crystal quartz is piezoelectric so that the mechanical vibration of the quartz is accompanied by a voltage oscillation across the crystal surfaces which is readily measured with simple electrical circuits. Because there is very low conversion of vibrational energy into heat energy, the crystal vibrates at a very sharp frequency. A typical high performance quartz oscillator is a few mm by tenths mm in size and vibrates at 5 MHz. To make a clock from this precision oscillator or frequency standard, the cycles of the vibration are counted electronically so that, e.g., after 5,000,000 cycles have been counted the time reading will be incremented by 1 second, etc.

There are, however, limitations to the stability of the frequency output of even the best of these crystal based clocks. The mounting and packaging of the crystal wafer leads to frequency drifts of a few parts in $10^{-12}$/day. The oscillation frequency depends on the physical size of the wafer and on the purity of the quartz so that no two wafers can have the same frequency of oscillation.

Atomic frequency standards are set apart from manmade composite resonators, e.g., quartz crystal or cavity resonators, by the inherent indistinguishability of one atom from another, for example, one $^{133}$Cesium atom from another. This quality ensures that atoms as clocks can be more reproducible in their operating frequency than any macroscopic crystal or cavity resonator ever constructed since no two macroscopic manmade resonators will ever be exactly identical. Atoms can absorb radiation of frequency $\nu$ in going from one energy level to another provided the levels are separated by energy $E=h\nu$ where h is Planck's constant. Atoms can thus be used as frequency discriminators or filters in their selectivity for absorbing radiation because a slight detuning from the atomic resonance frequency $\nu$ leads to a slight reduction in atomic absorption. Much of the technology involved in developing atomic clocks thus deals with efficient detection of the atomic resonance.

In typical operation, atomic frequency standards use the stability of an atomic resonance to steer a local oscillator (LO), usually a 5 MHz quartz crystal whose output frequency can be tuned via an input voltage. Because the atomic resonance frequencies for use in clock applications are typically 1 to 40 GHz, the 5 MHz frequency is multiplied up by 1000 or more to match the more stable atomic frequency. The inevitable frequency changes in the crystal are sensed by the atom and converted to an electrical correction signal to steer the crystal frequency so that its multiplied output matches the atomic transition frequency.

The various frequency standards on the market today differ in the choice of atom and the technique used to measure frequency deviations of the LO. The four most common atomic clocks in use today are based on transitions in atomic Hydrogen, Rubidium, Cesium and singly ionized Mercury positive ion. The invention described here pertains to frequency standards based on charged atomic or molecular ions of any sort. However, the preferred embodiment described below uses as an example the $^{199}$Hg+ atomic ion since in current laboratory practice systems using that ion have shown the most stable clock data.

The primary reason that electromagnetic ion traps are used as the basis for stable frequency standards is that in the environment of a trap, processes that equalize atomic state populations and destroy coherence within the state prepared atomic ensemble are very weak. In the past, coherence times have been measured in an ensemble of trapped Hg+ ions of over 30 sec on the 40.5-GHz transition. Such weak relaxation has permitted a resonance line width $\Delta\nu$ as small as 17 mHz on the 40.5-GHz transition. This line-Q ($\nu/\Delta\nu=2 \times 10^{12}$) enables good frequency discrimination for local oscillator (LO) fluctuations. [J. D. Prestage, R. L. Tjoelker, G. J. Dick, and L. Maleki, "Ultra-Stable Hg+ Trapped Ion Frequency Standard", Journal of Modern Optics, vol. 39, pp. 221-232, 1992.]

One disadvantage of a trapped ion-based frequency standard is the relatively low number of the confined ions. This leads to a low signal-to-noise ratio (SNR) in the detected atomic resonance and consequently limits clock stability. This situation was greatly improved by the use of a Linear Ion Trap (LIT). [J. D. Prestage, R. L. Tjoelker, R. T. Wang, G. J. Dick, and L. Maleki, "Hg+ Trapped Ion Standard Performance With the Superconducting Cavity Maser Oscillator as L.O.", Proc. 1992 IEEE Frequency Control Symposium, pp. 58-63, 1992.] By use of the LIT, the number of trapped ions was increased by a factor of more than 10 over conventional hyperbolic ion traps disclosed by Leonard S. Cutler et al., "A Trapped Mercury 199 Ion Frequency Standard," Proc. of Thirteenth Annual Precise Time and Time Interval (PTTI) Applications and Planning Meeting, NASA Conference Publication 2220, pp. 563-577, Dec. 1-3, 1981.

The stability reached with the improved SNR of the LIT together with the high line-Q has led to a tenfold improvement in clock stability over conventional ion-based clocks. In fact, that LIT-based clock shows stability competitive with the best H-masers for averaging times less than 10,000 sec and exceeds H-maser stability beyond 10,000 sec, making it the most stable of all clocks for long-term stability. However, the LIT-based clock is relatively recent in its development and its configuration continues to evolve. An object of this invention is to provide an improvement in the architecture of the LIT which will lead to improved long-term stability, and a substantial reduction in size, mass and cost of the final frequency standard.

The prior-art LIT-based clock for frequency standard operation is shown in FIG. 1. Ions are created inside a linear trap 10 (shown separately in FIG. 2 to a larger scale) by a pulsed electron beam from a grid electrode source 11. The LIT comprising a trap assembly of four parallel rods 12 spaced as shown schematically in FIG. 3 in an end view of the linear trap 10 which is enclosed in a high vacuum space shown in FIG. 1 as being bounded by magnetic shields 14. (All atomic frequency standards employ magnetic shields to reduce the magnetic field changes over time at the reference atom. Such field changes at the reference atom would shift its energy levels in an uncontrolled way over time and therefore degrade the clock stability.) State selection 194 nm (UV) light from a source comprising a $^{202}$Hg discharge lamp 15 is reflected by a mirror 16 and focused into the central portion of the ion trap 10 through a window 17. Light not absorbed by ions passes through that central portion and is dissipated in a horn 18. Resulting fluorescence from the ions is collected through a window 19 in a direction normal to the sheet of FIG. 2 using an optical detector 20 as shown in FIG. 3.

The pulsed electron beam from the source 11 ionizes a weak vapor of parent neutral atoms introduced into the vacuum space 13 from a heated HgO powder 21 shown in FIG. 1. They are trapped in the space between the ion trap rods 12 via the ponderomotive trapping force (J. D. Prestage et al., "New ion trap for frequency standard applications," J. Appl. Phys. 66, pp. 1013-1017, 1 Aug. 1989) generated by the quadrupole rf bias on the four trap rods. This force confines the ions in the transverse direction. To prevent the ions from escaping along the trap longitudinal axis, a positive bias potential (B+) on end electrodes 22 that are electrically insulated from the trap rods 12 by support elements 23 shown in FIG. 2, and shown in further detail in FIG. 3 of the aforesaid paper of Prestage et al. hereby incorporated by reference. Before the stable atomic frequency of the trapped ions can be compared with the multiplied output of a tuned oscillator 24 shown in FIG. 3, a population difference between the hyperfine levels F=0 and F=1 of the ground state must be created. This preparation is accomplished by optical pumping with the UV light (194 nm) from the lamp 15.

In operation, ions of the neutral vapor of $^{199}$Hg created by the pulsed electron beam from the grid electrode source 11 are held along the ion trap axis. A helium buffer gas ($10^{-5}$ mbar) introduced into the vacuum space 13 collisionally cools the ions to near room temperature. The UV light from the $^{202}$Hg discharge lamp 15 optically pumps the ions from the F=1 into the F=0 hyperfine level of the ground state. Thermal motion of the ions along the length of the trap will carry all the ions through the interrogation light field in front of the window 19 indicated in FIG. 2 so that pumping is complete in about 1.5 sec for typical lamp intensities. The lamp 15 is then turned off and tuned microwave (R.F.$\approx$40.5 GHz) energy from the oscillator 24 is turned on. The microwave energy thus introduced into the interrogation light field 19 via a waveguide 25 and horn 26 shown in FIG. 1 produces resonance with the pumped ions causing them to return to the F=1 level. It is necessary to reduce the UV light level to or near zero during the microwave irradiation period to prevent light shifts and broadening of the clock transition. The microwave energy is then turned off and the pumping lamp 15 is turned on again as shown in FIG. 4 to pump the ions again from the F=1 into the F=0 level, thus producing fluorescence. During the 1.5 second interval following lamp turn-on time, a counter 27 (FIG. 3) is turned on to measure the $^{199}$Hg$^+$ clock transition back to the F=0 level. A fitted curved line shown in FIG. 5 may be plotted by detection of fluorescence at frequencies above and below a center line at 40,507,348,770 Hz. Measurement of fluorescence accomplished during a 1.5 sec period following the termination of the microwave radiation period is thus a measure of how close the oscillator 24 is tuned to the $^{199}$Hg$^+$ atomic frequency of 40,507,348,770 Hz.

Ideally, the microwave energy source (oscillator 24) would be tuned to 40,507,348,770 Hz for $^{199}$Hg$^+$ clock resonance. However, it is not possible to measure the light and maintain oscillator operation with a peak center line precisely that frequency because if it drifts off that frequency so that a different measurement is made during the next cycle of operation it is then not possible to determine the direction of drift in order to introduce a correction in the frequency of the oscillator 24 operating as the microwave energy source. Consequently, the practice is to alternately detune or modulate the microwave frequency that is applied to the ions (as shown in FIG. 5) by $+\Delta\nu$ and then $-\Delta\nu$ during the next cycle. Any detuning of the oscillator 24 from the center of the atomic resonance frequency 40,507,348,770 will cause a corresponding modulation of the atomic fluorescence during the preparation mode of pumping ions with the microwave signal from the oscillator 24. The frequency of the oscillator is subsequently adjusted to null the difference in light fluorescence obtained at the $+\Delta\nu$ and $-\Delta\nu$ points. The condition of null fluorescence difference can only occur when the multiplied output of the oscillator is centered on the atomic resonance since then and only then will frequency detuning to $+\Delta\nu$ and $-\Delta\nu$ give equal fluorescence levels on opposite sides of the symmetric curve shown in FIG. 5.

In practice the size of the modulation $\Delta\nu$ is chosen to be the frequency offset from the center line to the point of steepest slope of the atomic resonance curve of FIG. 5. This step corresponds approximately to the frequency at which the fluorescence is one half the peak or central value. Note that the oscillator frequency is steered to follow the atomic resonance while the modulation which is applied to the ions is generated by modulating the output of the synthesizer by $\pm\Delta\nu$ and mixing this signal with the multiplied output of the LO. The LO is steered but not directly modulated. In that manner, the precise frequency standard is maintained over an extended period of time to obtain stability of the peak center line at $40,507,348,770 \pm 2 \times 10^{-15}$ Hz for extended averaging times of about 20,000 sec (5½ hr). Thus, the prior art LIT-based frequency standard shown in FIG. 1 uses the technique of 194 nm(UV) optical pumping in a first preparation and interrogation (measurement) mode, and irradiating with tuned microwave energy in a second resonance mode in order to probe the hyperfine clock transition in $^{199}$Hg$^+$ ions immediately after switching back into the first mode.

During the microwave radiation period, it is critical that the atomic resonance frequency not be perturbed by any changes in the trap environment. Such fluctuations would be transferred to the local oscillator, thereby degrading clock stability. Because the preparation (state selecting) UV light will shift the atomic clock resonance, it is switched off during the resonance (microwave energy radiation) mode. Thus, immediately following the microwave energy radiation, the UV lamp is turned on again as shown in the timing diagram of FIG. 4 to determine the extent the microwave radiation has changed the population of the hyperfine levels of the atomic ions during the $+\Delta\nu$ and $-\Delta\nu$ successive cycles of the dual mode. Any frequency detuning of the oscillator 24 from the reference atomic frequency will change the fluorescent light intensity measured when the UV lamp is turned on.

These fluorescence changes are converted to a voltage and fed back by a computer 24a to a frequency control input of a crystal oscillator 24b to keep it on the frequency of the $^{199}$Hg$^+$ transitions. The crystal oscillator provides a 5 MHz output which drives a frequency multiplier 24c and a 7.348XXX MHz synthesizer 24d, respectively. The outputs of the multiplier and synthesizer are combined in a mixer 24e to provide a microwave frequency output to be compared to the atomic frequency $\nu$. The synthesizer is used to introduce the $\pm\Delta\nu$ modulation. Both the crystal oscillator and the synthesizer are controlled by the computer 24a for correction of the microwave frequency standard desired out of the crystal oscillator 24b which is then provided as an output to the user. Thus, the computer corrects the output frequency of the crystal oscillator based on the outcome of the atomic fluorescence measurements and offsets the synthesizer by $+\Delta\nu$ and $-\Delta\nu$ to points of steepest slope on each side of the atomic resonance curve shown in FIG. 5 for successive measurement cycles. In that manner the computer 24a may determine not only the extent the crystal oscillator has drifted from the precise frequency desired as an output to a user, such as 5 MHz, but also the direction of drift so that an error voltage signal may be produced via a digital to analog (D/A) converter 24f to bring the crystal oscillator back to the desired output frequency to within $\pm 2 \times 10^{-15}$.

It is apparent from the foregoing discussion on the timing diagram of FIG. 4 that the singular ion trap of FIG. 2 is operated in two modes in the process of controlling the crystal oscillator 24b. In the first mode, with the UV lamp on, the atomic ions are prepared for microwave frequency comparison with the multiplied local oscillator frequency output. In the second mode, with the microwave signal on, the atomic frequency is compared with the microwave signal frequency. During the first (preparation) mode, there are no stringent requirements on environmental isolation or regulation, whereas during the second (resonance) mode, great care must be exercised in regulation of the atomic environment to assure stable atomic frequency operation. It would be desirable to carry out the two modes of (1) preparation of the atomic ions for frequency comparison to the microwave signal frequency and (2) comparison of the microwave frequency to the atomic frequency using separate ion traps implemented as two separate regions of the present invention as described below with advantageous relaxation of many of the constraints of the prior-art LIT.

STATEMENT OF THE INVENTION

In accordance with the present invention, an Extended Linear Ion Trap (ELIT) is provided and divided into two regions. The first region comprises a first ion trap having multiple rods, such as two or preferably four parallel rods, in a housing with vacuum flanges to provide: a connection to a necessary vacuum pump for preparing the space in the ion trap to receive vaporized atoms; a pulsed source of electrons for ionizing the vaporized atoms, thereby producing a cloud of ions in the trap; a UV light transmitting window to receive ion state preparation UV radiation; opposite the UV light transmitting window, means for dissipating UV light energy not absorbed by the ions; and a fluorescence viewing window positioned for viewing in a direction normal to the axis of the UV light transmitting window. The UV light alters the ions from a first energy $F=1$ state to a second energy state $F=0$, and in the process produces fluorescence the intensity of which is a function of the number of ions being so altered by the UV radiation.

The second region comprises a second ion trap positioned as an axial extension of the first ion trap in a vacuum housing that is an extension of the vacuum housing for the first region. A tubular magnetic shield is provided around the second region and a gap for dc voltage discontinuity is provided in the rods of the two ion traps at a plane between the two ion trap regions in order to allow ions trapped in one region to pass to the other under separate control of a dc voltage of the rods of each ion trap relative to the rods of the other ion trap, while rods of both ion traps receive the same alternating trapping voltages such that transverse containment of the ions is continuous across the gap between the two regions. By providing separate dc voltage control means, the ion traps of the first and second regions may be controlled so that either one may be placed at a positive voltage level relative to the other. In that manner ions can be transported across the gap from the one at the positive voltage level to the other while the other is held at a lower voltage level, preferably at a zero voltage level.

While the ion trap of the first region is switched to a positive voltage level with respect to the ion trap of the second region, ions in the first region are forced into the ion trap of the second region for comparison of a microwave signal to the atomic frequency of the ions by resonance which alters the state of ions from the second energy state $F=0$ back to the first energy state $F=1$ with the number of ions altered being a maximum when the microwave signal frequency equals the atomic ion frequency. When the ion trap of the second region is switched to a positive voltage with respect to the ion trap of the first region, ions in the second region are transported back into the ion trap of the first region by pumping with UV light radiation from the energy state F=1 to the energy state F=0 resulting in fluorescence. The fluorescent light intensity is measured while the light is on. The intensity of detected fluorescence peaks at a frequency where the microwave signal matches the atomic frequency of the ions and falls as the frequency difference $\pm\Delta\nu$ increases. By alternating the modulation of the microwave resonance signal between $+\Delta\nu$ and $-\Delta\nu$ during successive resonance modes, a difference in fluorescence is measured during each following mode of preparation by UV radiation. The computed difference provides a signal for steering the microwave signal to the atomic frequency $\nu$ of the ions.

After the time of transporting ions across the gap plane in either direction, but at least following the time of transporting ions into the second region, a positive voltage is applied to short auxiliary rods parallel to the trapping rods that are spaced around the trap rods to straddle the gap plane. This positive voltage assists in moving all ions transported further into the receiving trap and away from the gap plane. This moves the ions further from the entrance to the magnetic shields surrounding the resonance region whose opening approximately coincides with the gap plane between the two trap regions. The shielding strength is much more effective away from the opening at the end of the cylindrical shields. This is particularly important when the second region is the receiving ion trap for comparison of the frequency of the microwave signal to the ion frequency $\nu$.

While initially loading the first region of the ELIT with vaporized atoms, a positive voltage is applied to the ion trap of the second region and the electron source is turned on to ionize the vaporized atoms. Once they are ionized and state prepared by the UV light, a positive voltage is applied to the ion trap in the first region while dropping the voltage applied to the ion trap in the second region in order to transport the ions into the second region. The ion traps of the first and second regions are then alternately driven positive with respect to each other during use of the ELIT as a frequency standard apparatus operating in a dual-mode manner similar to the LIT-based frequency standard, except that now the ions are shuffled between two separate regions of the extended ion trap rods during the two separate modes. All of the conventional techniques that have been developed for frequency standards based upon ion traps may be employed in the present invention, such as providing a solenoid or other current carrying loop wound around the ion trap of the second region within its magnetic shielding to provide a low level magnetic reference field during microwave frequency comparison (resonance).

A very significant advantage of this ELIT architecture is that only the second region requires shielding, and the volume of that shielded region may be reduced by a factor of about 100 because the magnetic shields required may be 10 times smaller in diameter. The larger, essentially cubical first ion trap region does not require shielding for the function carried out there during the first mode, namely preparation of the ion state for later comparison (resonance) in the second region during the second mode. This results directly from extending the rods of an unshielded ion trap into a second ion trap in a shielded region and dividing the resulting extended trap into two dc-isolated regions with air gaps in the rods at a plane between the two regions. This arrangement allows for the conventional practice of applying rf trapping voltages to all trapping rods of both regions across the gap between the regions for transverse containment of ions present throughout the entire length of both regions.

BRIEF DESCRIPTION OF THE DRAWINGS

FIG. 6 is a diagram of an Extended Linear Ion Trap (ELIT) of the present invention for use in frequency standard apparatus, and FIG. 6($a$) illustrates a view looking down on a ceramic ring at the bottom of the ELIT as viewed in FIG. 6 for support of the four ion trap rods and a centered electrode biased positive to hold the ions between that electrode and a centered electrode supported by a similar ceramic ring at the top of the ELIT.

FIGS. 7($b$) and 7($c$) are graphs of dc bias voltage applied to the first region with respect to the second region for a 7($b$) resonance mode and a 7($c$) preparation mode, respectively, in the operation of a frequency standard employing the extended linear ion trap of FIG. 6, and FIG. 7($d$) illustrates a positive voltage applied to electrodes surrounding the gaps between rods of the first and second regions of the ELIT, shown in FIG. 7($a$).

FIG. 9 is a timing diagram for the operation of the apparatus shown in FIG. 8.

DESCRIPTION OF PREFERRED EMBODIMENT

Figure 1:
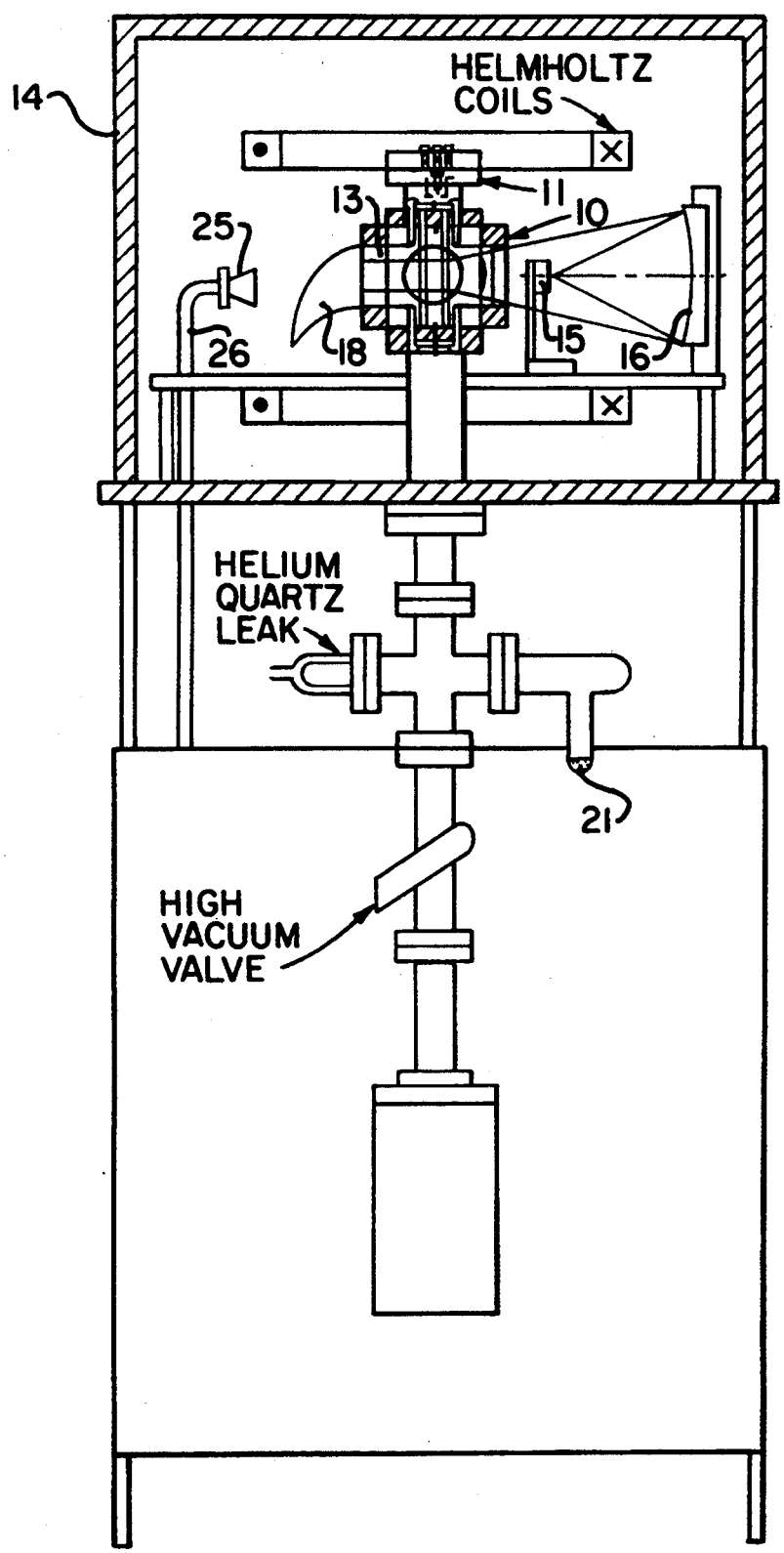
FIG. 1 illustrates a prior-art linear ion trap for frequency standard applications.
Figure 2:
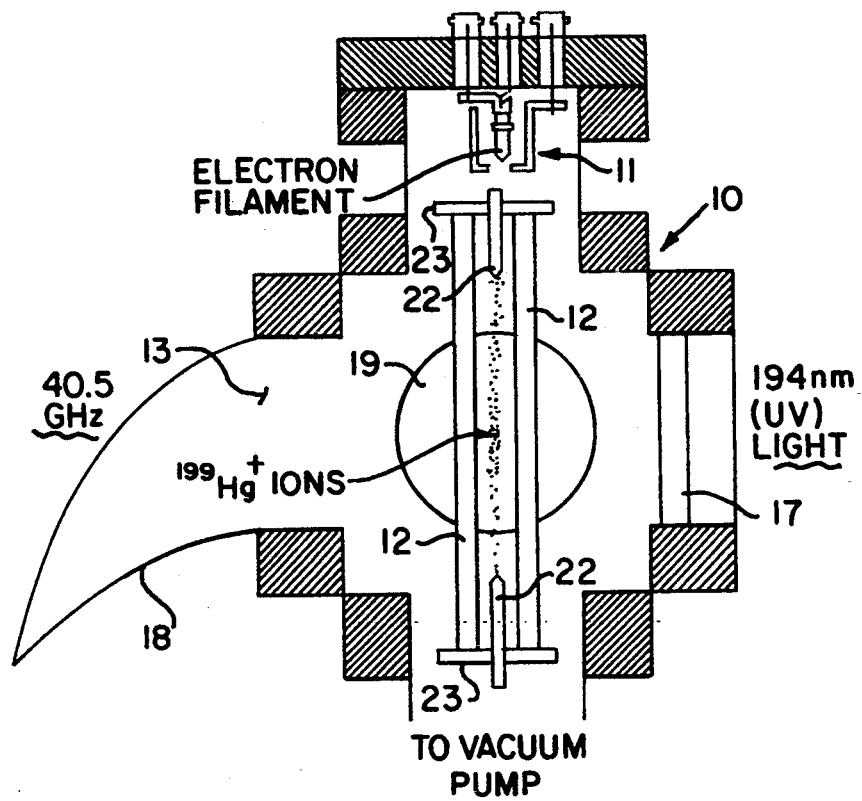
FIG. 2 illustrates to a larger scale the prior-art linear ion trap (LIT) of FIG. 1.
Figure 3:
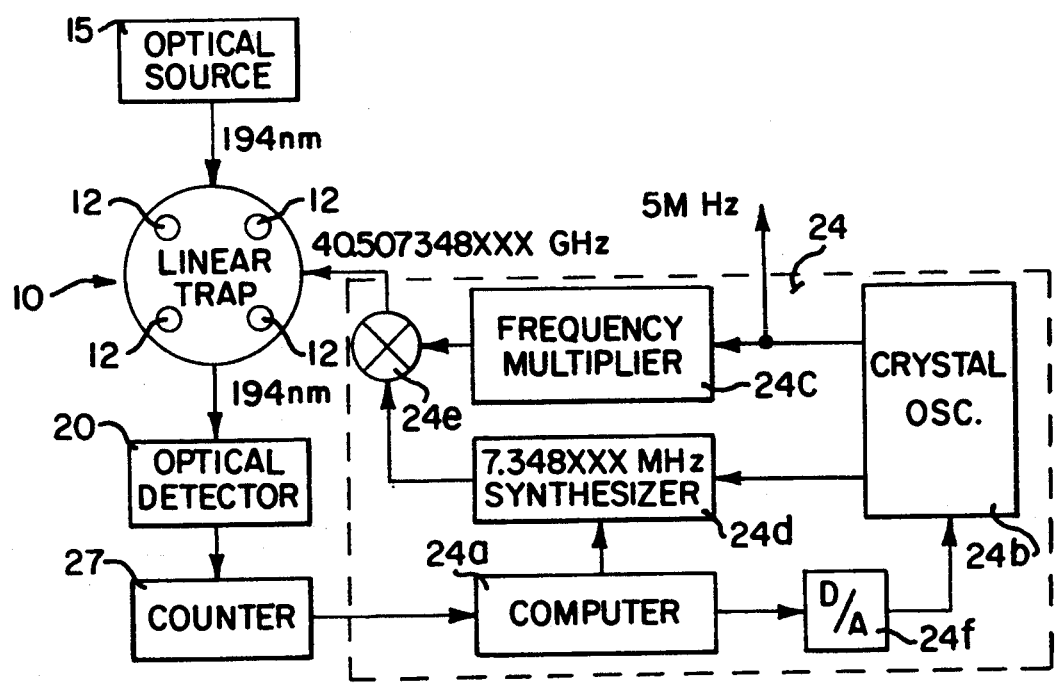
FIG. 3 is a block diagram of a crystal oscillator in a closed-loop under control of a computer for operation of the linear ion trap of FIG. 2 as a frequency standard.
Figure 4:
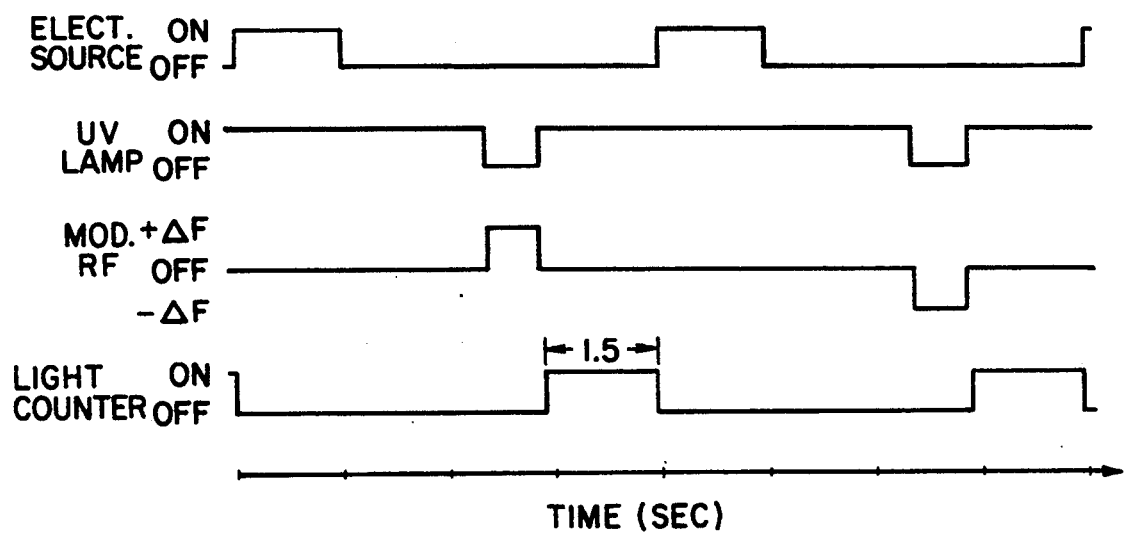
FIG. 4 is a timing diagram for the operation of the linear ion trap of FIG. 2.

Referring to FIG. 6, an improved physics unit of a linear ion trap for frequency standard apparatus is provided by extending trap rods 29 corresponding to rods 12 of the ion trap of the prior-art LIT shown in FIGS. 1 and 2, and dividing the rods 29 into two sections with an air gap at a plane 30 to form a first linear ion trap region 31 which is similar to the LIT but does not require shielding and may be made much smaller, and a second linear ion trap region 32 for resonance which does require magnetic shielding. That shielding may be provided by a plurality of concentric tubular shields, such as three tubular shields 33 shown. The shielded space is reduced in volume by a factor of about 100 as compared to the prior-art LIT because the diameter of the tubular shields is reduced by about a factor of 10 as compared to that of the prior-art LIT. Moreover, this improved physics unit relaxes many of the design constraints of the prior-art LIT by separating from the ion loading and fluorescence functions in the first region 31 the ion resonance function to be carried out in the second region 32. The ions are shuttled back and forth between the first and second regions during alternate preparation/interrogation and measurement/resonance modes of continuous frequency standard operation, as will be described with reference to FIGS. 7(a) through 7(d).

The air gaps in rods 29 provide a dc discontinuity in order that the rods of the first region 31 may be biased independently of the rods of the second region 32 while forming an ac junction between the rods of these two regions to allow rf trapping voltage to be applied along the entire length of the rods for transverse containment of the ions. Thus, under control of positive dc bias voltages applied to the rods in the two regions separately to move positive ions from one region to the other, as will be described in more detail with reference to FIGS. 7(a) through 7(d), continuous rf trapping voltage is applied to all four rods of both regions as shown in FIG. 6(a) for transverse containment of the ions.

Figure 8:
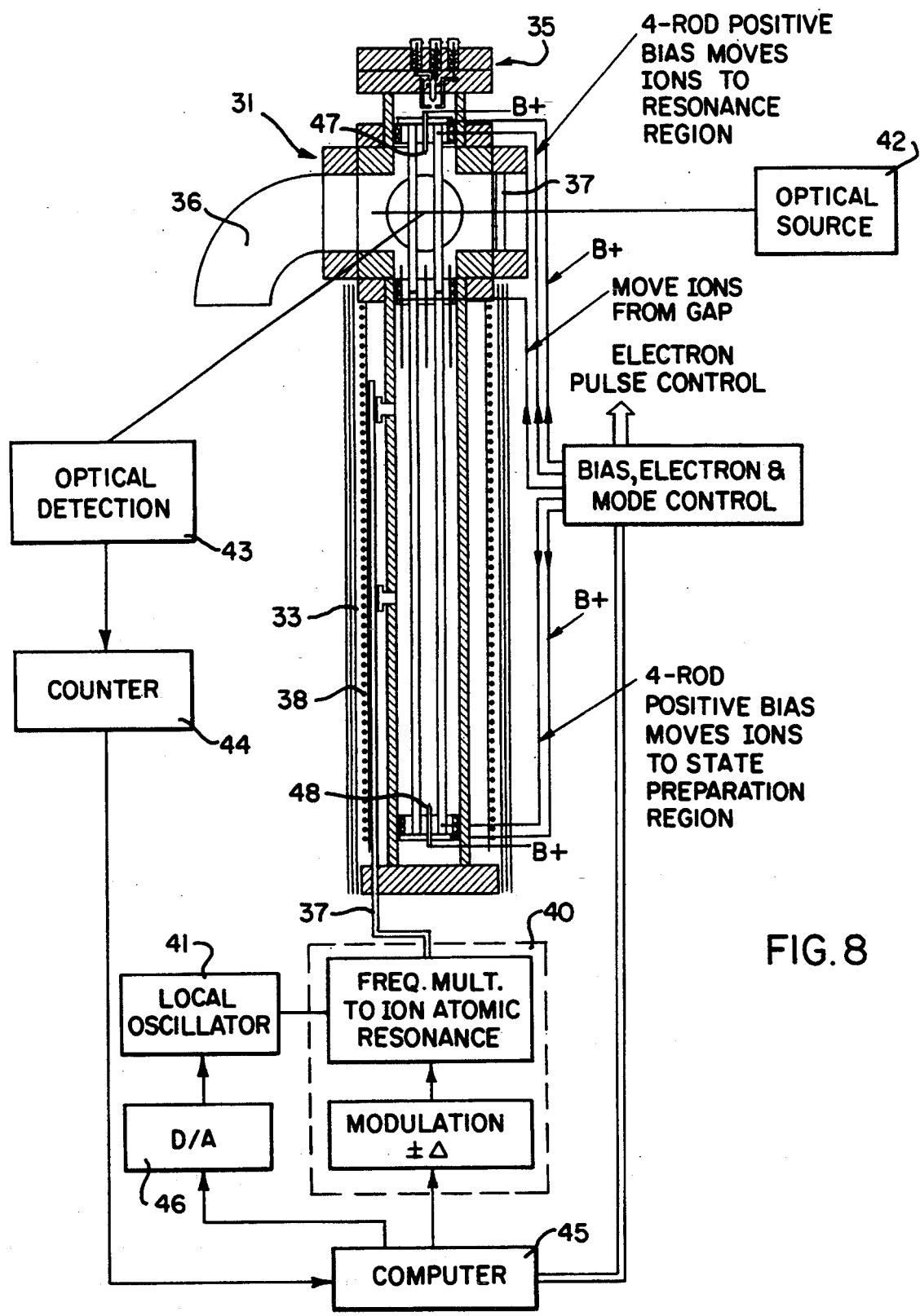
FIG. 8 is a functional block diagram of the present invention shown in FIG. 6 used in frequency standard apparatus.

Although a bias, electron and mode control unit 34 is shown connected to only one rod, it should be understood the control unit applies positive bias to all four rods of the ion trap region 31 independently of all four rods of the ion trap region 32 as indicated in FIG. 8 while all four rods of both regions receive the rf voltage. That control unit also controls turning on an electron source 35 to ionize $^{199}$Hg atoms in the trap region 31. The atoms of $^{199}$Hg are introduced by means (not shown) through an elbow 36 connecting a vacuum pump (not shown) to the region 31 in a manner similar to that shown and described in the prior-art LIT of FIG. 1. It should be noted that UV (194 nm) light from a lamp (not shown) is focused through a window 37 into the central portion of the first ion trap region 31, and that the UV light not absorbed by ions is dissipated in the elbow 36 which serves the function of the horn 18 in the prior-art LIT of FIG. 1.

Figure 7A:
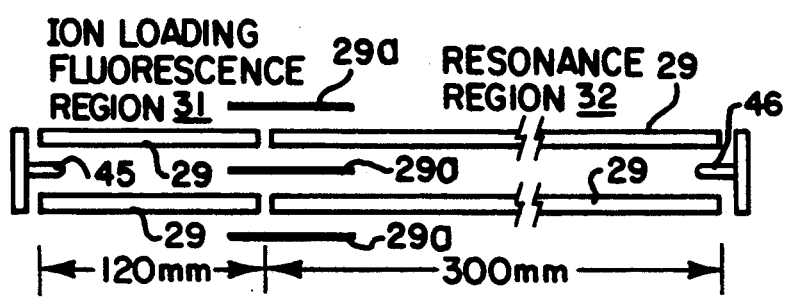
FIG. 7($a$) is a diagram defining a first (ion loading, fluorescence and preparation) region and a second (ion resonance) region of the extended linear ion trap ELIT of FIG. 6.
Figure 7B:
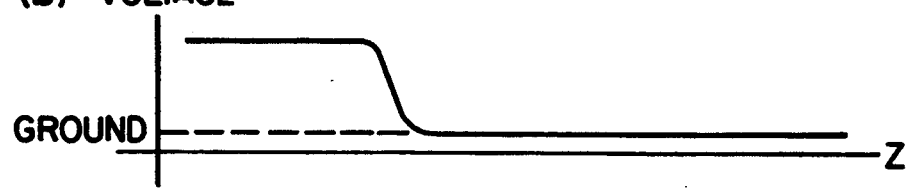
Figure 7C:
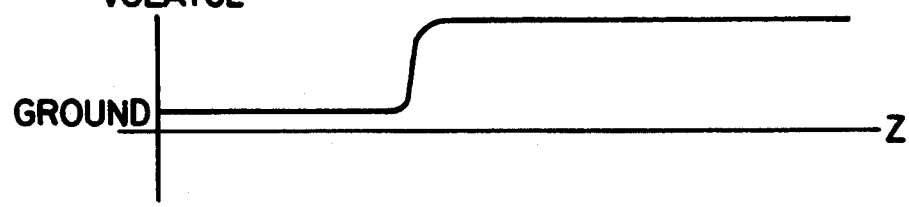
Figure 7D:
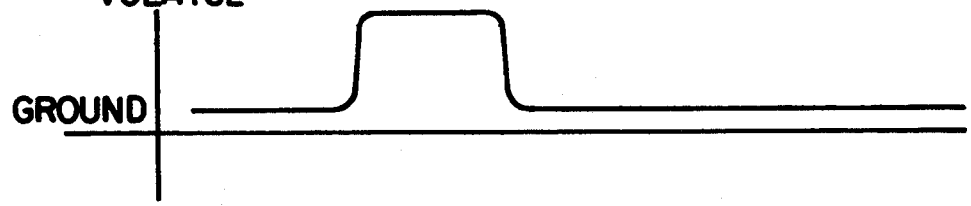

When the dc voltage levels of all trap rods 29 are the same in both the first region 31 and second regions 32, thermal motion of ionized atoms will carry them through the air gap shown more clearly in FIG. 7(a) with no change in axial velocity, but when the trap rods 29 in the second region 32 are raised to a positive dc voltage with respect to the rods in the first region 31 as shown in FIG. 7(c), ions within a trap radius or so of the gap will be transported across the gap into the first region. Only the ions near the gap will experience the electric field forcing them across the gap. Since each ion is in thermal motion along the axis of the trap, it will reach the gap which is the trap-length transit time (typically about 1 msec) and then be pulled into the first region 31, emptying the second region 32 of ions, as shown in FIG. 7(c). Similarly, when the rods 29 of the first region 31 are dc biased positive with respect to the rods 29 of the second region 32 as shown in FIG. 7(b), all ions will be transported from the first (ion loading and fluorescence) region 31 to the second (resonance) region 32. Short auxiliary rods 29a parallel to the trapping rods are spaced around the trap rods 29 and straddle the gap plane 30. When ions have transported into the resonance region, these auxiliary rods 29a are pulsed positive, as shown in FIG. 7(d), to assist in moving the ions further into the resonance region.

The separation of the resonance region 32 from the optical and ion loading region 31 relaxes many of the design constraints of the prior-art LIT, as noted hereinbefore, because the microwave resonance region can now be designed without any consideration of optical issues. A simple set of tubular magnetic shields 33 and a current coil 38 (corresponding in function to the Helmholtz coils in the prior-art LIT of FIG. 1) supply a very uniform and stable magnetic environment within the ion trap in the resonance region 32 now separated from the loading and fluorescence region 31.

Since the resonance region 32 requires the most stringent temperature regulation of the entire physics package, size reduction enables simplification of thermal control of the standard. Similarly, the state selection optics in the first region 31 now separated from the resonance region may be designed without perturbing the atomic resonance in the second region 32, and therefore designed with a significant reduction in size and without other design constraints For example, the optical components are no longer required to be nonmagnetic as in the prior-art LIT of FIG. 1. The custom-made copper-titanium flanged UV transmitting windows in the prior-art LIT can be replaced with stainless steel flanged windows, which are each about $2,000 less expensive. The $4,000 nonmagnetic UV light-collecting horn is replaced by a stainless steel elbow 36 connecting the first region 31 to the vacuum pumps. The light source can be moved to the window 37 and therefore much closer to the ion cloud, raising the possibility of using a collimated UV source with the collection mirror 16 of the prior-art LIT of FIG. 1, thus further reducing the final package size to overall dimensions of 10 cm by 50 cm.

Similar modifications could be made in the fluorescence collection arms to reduce size. These design changes would not allow stable clock operations if the ions underwent microwave frequency resonances inside the first (optical state selection) region 31 as in the prior-art LIT, because of the large magnetic shifts of the atomic levels induced by the close proximity of the light source and detectors. Another simplification gained by relaxing the nonmagnetic requirement is in the electron source and its heater current supply. The electron source for ion creation is now remote from the atomic resonance region 32, allowing use of a conventional (magnetic) filament base and a floatable dc current drive. In the design of the prior-art LIT shown in FIG. 1, ions are created inside the resonance region and require a floating audio frequency filament heater current to prevent the residual dc magnetic field from the electron gun from shifting the atomic ion frequency.

Additionally, the largest frequency offset and potential instability can be reduced greatly by selecting a somewhat longer trapping length, L, in the atomic resonance region 32. This frequency shift stems from the finite (i.e., non-zero) ion cloud diameter in which ions spend time in regions of large rf trapping fields where their motion results in frequency pulling via the second-order Doppler or relativistic time dilation effect. The magnitude of this offset depends only on the linear ion density, N/L, and is given by $$\left(\frac{\Delta f}{f}\right) = -\left(\frac{e^2}{8\pi\epsilon_0 mc^2}\right)\frac{N}{L}.$$

where N is the total ion number as set forth in Prestage et al., (1989) and where $f$ is the atomic frequency $v$ and $e^2$ is the square of the electron charge. A further increase in the resonance trapping length to about 200 mm would reduce the clock sensitivity to ion number variations by about a factor of 4. Since ion number stabilization to the 0.1 percent level has been demonstrated for $10^{-15}$ frequency standard operation in that system, an ion number-induced instability noise floor below $2.5 \times 10^{-16}$ should be achievable in this modified ELIT architecture.

FIG. 9 is a timing diagram which illustrates the operation of the ELIT frequency standard shown in FIGS. 6 and 8. The first waveform indicates the ion location which begins in the first state preparation and ion creation region 31 because its rod bias is low relative to that of the second resonance region 32. During this state #1, the electron source 35 is pulsed to ionize atoms as indicated by the second waveform. When the region 31 is biased positive relative to the region 32, the ions are transported to the second ion location, namely the resonance region 32. At that time (as shown in FIG. 8) microwave signal energy offset $+\Delta\nu$ is introduced into the ion trap region 32 through a waveguide 37 and ports 39 (as shown in FIG. 6) from a frequency synthesizer 40 which modulates the output of a local oscillator 41 operating at 5 Mhz as it is multiplied to ion atomic resonance frequency of $\nu+\Delta\nu$. The $+\Delta\nu$ modulated microwave energy is again introduced into the second ion trap region 32 just before the ions are transported back into the first ion trap region 31.

UV light from a source 42 is continuously focused into the center of the first ion trap 31 for preparation of ions, i.e., shifting ions from the $F=1$ level to the $F=0$ level, at any time they are present in the trap so that when they are transported to the second ion trap 32 and microwave energy is introduced into the second ion trap 32, resonance will shift a number of ions back to the $F=1$ level that increases as the microwave energy is detuned from the atomic frequency $\nu$. Thus, when the ions are transported back to the first ion trap region 31 that number of ions will be shifted from the $F=1$ level to the $F=0$ level. The fluorescence photons are then detected in an optical detector 43 and counted in a counter 44 as indicated by the UV light counter timing waveform in FIG. 9.

Figure 5:
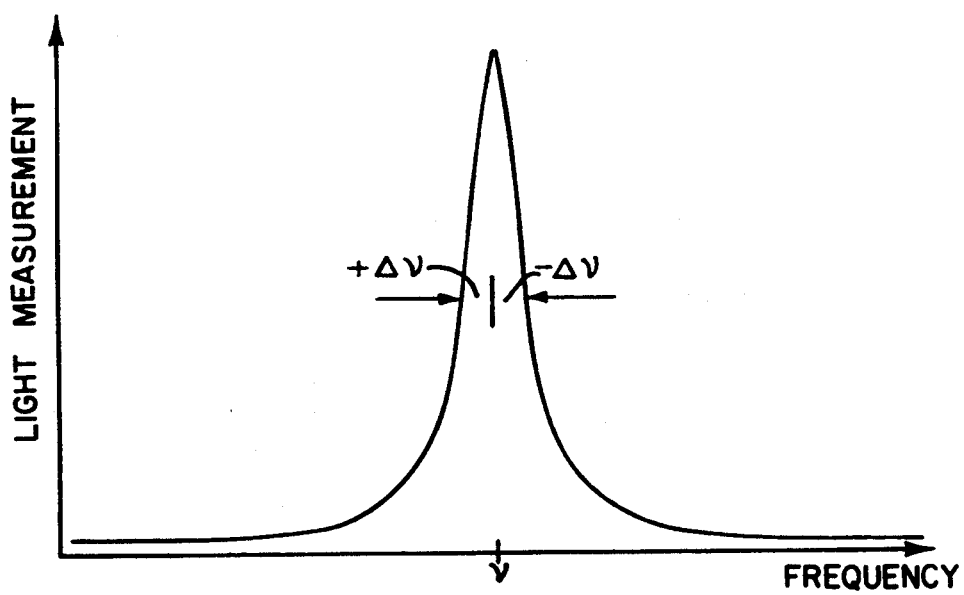
FIG. 5 is a graph of the light fluorescence versus local oscillator frequency tuning through the $^{199}Hg^{+}$ clock transition frequency $\nu$.

Once the UV light counter 44 is turned off, the electron pulse source 35 is turned on again to restore a full population of ions and the two-mode cycle is repeated by transporting the ions back into region 32 for resonance, but in this next cycle the microwave signal is modulated by $-\Delta\nu$. The output of the counter 44 outputs the count of both the $\Delta\nu$ and the $-\Delta\nu$ offset to a computer 45. The computer then computes the difference between the two successive counts. If the local oscillator 41 is stable at 5 Mhz, the resulting sum will be zero because the fluorescent light measurement will be the same because the offset from the center line will be the same for the $+\Delta\nu$ measurement as for the $-\Delta\nu$ measurement as shown in FIG. 5. Note that the $+\Delta\nu$ and $-\Delta\nu$ points are both selected to be half the center line width at half the maximum peak for maximum sensitivity in the difference between the $+\Delta\nu$ and $-\Delta\nu$ measurements. If the center line frequency drifts up or down, the curve shown in FIG. 5 will shift relative to the atomic frequency $\nu$ center line and the difference between those measurements will shift from zero as a function of the extent of drift and the sign of the difference will indicate the direction of shift. In that manner, a plus or minus digital error is computed in the computer 45 which is then converted in a digital-to-analog converter 46 from a digital error to an analog error signal to correct the local oscillator 41 a proper amount in the proper direction to reduce the error to zero.

It will be recognized that the operation of the ELIT of FIG. 6 as described with reference to FIGS. 5–9 is essentially the same as for the prior-art LIT as described with reference to FIGS. 1–4, including end pins 47 and 48 that are biased B+ to confine the ions within the regions 31 and 32 best shown in FIG. 6. The difference is in the structure of the ion trap of FIG. 6 which is extended to provide two separate ion traps for the dual mode operation which is otherwise essentially the same as for the prior-art LIT of FIG. 1. That difference then yields the important advantageous relaxation of many of the constraints of the previous LIT architecture.

I claim:

1. An extended linear ion trap for frequency standard apparatus, said ion trap having two regions axially aligned for dual mode operation,
    a first region for preparing atomic ions during a first mode by optical pumping from a ground state level to another energy level, said atomic ions being prepared for atomic frequency comparison to a microwave signal, said signal being derived from a local oscillator,
    a second region for comparing said atomic frequency of said prepared atomic ions during a second mode by resonance of said atomic ions with said microwave signal,
    voltage controlled means for transporting said atomic ions prepared in said first region during said first mode into said second region for comparison during said second mode, and for transporting said atomic ions back to said first region for a repeat of said first mode, thus completing one of a continuous succession of dual mode operations, and
    magnetic shielding of only said second region.

2. An extended linear ion trap as defined in claim 1 wherein said two regions axially aligned comprise
    multiple ion trapping rods mutually parallel and equally spaced,
    rf voltages applied to said trapping rods for creating electromagnetic fields for radial confinement of said atomic ions to a space between said parallel rods,
    dc biased and axially aligned pins at each end of said trapping rods for axial confinement of said atomic ions,
    a gap in each of said trapping rods in a common plane normal to said trapping rods, thereby providing dc discontinuity between two regions of each of said trapping rods to provide a linear ion trap having first and second regions axially aligned without interference with said rf voltages applied to said trapping rods for radial confinement of said atomic ions, and
    wherein said voltage controlled means for transporting said atomic ions between first and second regions comprises biasing said trapping rods of said first region at a voltage level higher than a voltage level of said second region for transporting said atomic ions into said second region, and switching voltage levels of said two regions for transporting said atomic ions from said second region to said first region.

3. An extended linear ion trap as defined in claim 2 further comprising a plurality of short auxiliary rods straddling said gap plane, said short auxiliary rods being parallel to said trapping rods and radially spaced from the center of said linear ion trap, and means for applying a voltage to said short auxiliary rods to assist moving ions transported from one region further into the receiving region.

4. An extended linear ion trap as defined in claim 3 wherein said voltage is applied to said short auxiliary rods to assist moving ions transported from said first region further into said second region for resonance.

* * * * *